US012581629B2

(12) United States Patent
Park et al.

(10) Patent No.: US 12,581,629 B2
(45) Date of Patent: Mar. 17, 2026

(54) ELECTROMAGNETIC SHIELDING COMPOSITION CONTAINING MORPHOLOGICALLY DIFFERENT METALS

(71) Applicant: BIONEER CORPORATION, Daejeon (KR)

(72) Inventors: Han-Oh Park, Sejong (KR); Jae-Ha Kim, Daejeon (KR); Jun Pyo Kim, Daejeon (KR); Jieun Kim, Daejeon (KR)

(73) Assignee: BIONEER CORPORATION, Daejeon (KR)

( * ) Notice: Subject to any disclaimer, the term of this patent is extended or adjusted under 35 U.S.C. 154(b) by 20 days.

(21) Appl. No.: 18/577,861

(22) PCT Filed: Jul. 18, 2022

(86) PCT No.: PCT/KR2022/010437
§ 371 (c)(1),
(2) Date: Jan. 9, 2024

(87) PCT Pub. No.: WO2023/003297
PCT Pub. Date: Jan. 26, 2023

(65) Prior Publication Data
US 2025/0194068 A1     Jun. 12, 2025

(30) Foreign Application Priority Data

Jul. 20, 2021   (KR) ........................ 10-2021-0094838
Jul. 15, 2022   (KR) ........................ 10-2022-0087314

(51) Int. Cl.
*H05K 9/00*          (2006.01)

(52) U.S. Cl.
CPC .................................... *H05K 9/009* (2013.01)

(58) Field of Classification Search
CPC ............. B05D 1/02; H05K 9/00; H05K 9/009
See application file for complete search history.

(56) References Cited

U.S. PATENT DOCUMENTS 10,844,198 B2    11/2020   Park et al.
2015/0174860 A1*   6/2015   Ellis ........................ B32B 15/09
156/247

FOREIGN PATENT DOCUMENTS

JP        2019535850 A     12/2019
JP        2020094170 A      6/2020
KR       20160135512 A     11/2016
KR        101687043 B1     12/2016

(Continued)

OTHER PUBLICATIONS

JP2024503736, "Office Action", Feb. 17, 2025, 8 pages.

*Primary Examiner* — Khanh T Nguyen
(74) *Attorney, Agent, or Firm* — DICKINSON WRIGHT PLLC

(57)                ABSTRACT

An electromagnetic shielding composition according to the present invention is directed to an electromagnetic shielding composition capable of forming an electromagnetic shielding film with excellent electromagnetic shielding capacity and flexibility and, specifically, comprises: a core-shell structured metal nanowire comprising a core containing copper and a shell containing silver on the core; and plate-like metal particles selected from plate-like silver particles and silver-coated plate-like copper particles.

14 Claims, 1 Drawing Sheet

Plate-shaped silver particle          Silver-coated copper nanowire

(56)            References Cited

FOREIGN PATENT DOCUMENTS

| KR | 101789213 | B1 | 10/2017 | | |
|----|-----------|----|---------|--|--|
| KR | 20170134337 | A | 12/2017 | | |
| KR | 102147102 | B1 * | 8/2020 | .............. | B05D 1/02 |
| WO | WO 2018084518 | A1 * | 5/2018 | .............. | C08K 3/08 |

* cited by examiner

[FIG. 1]
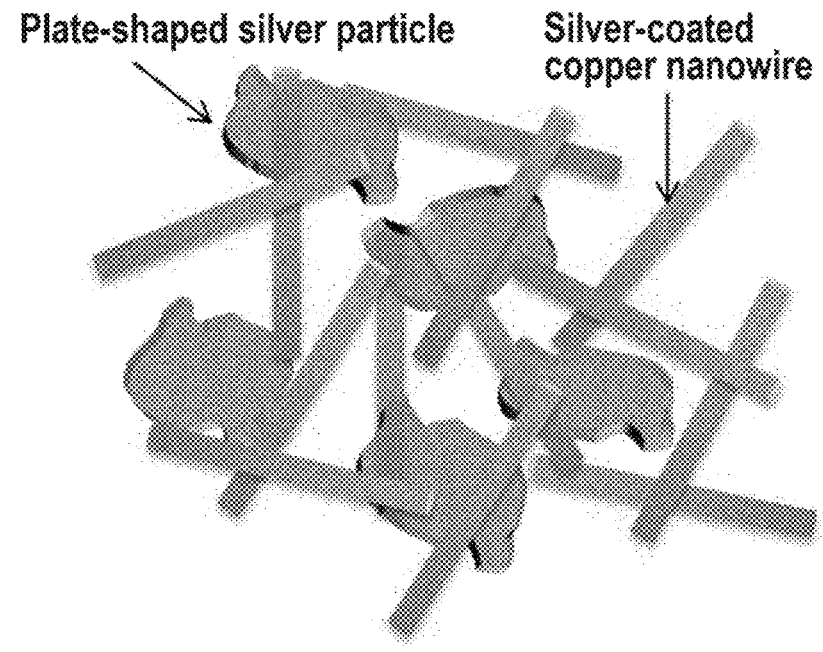
[FIG. 2]
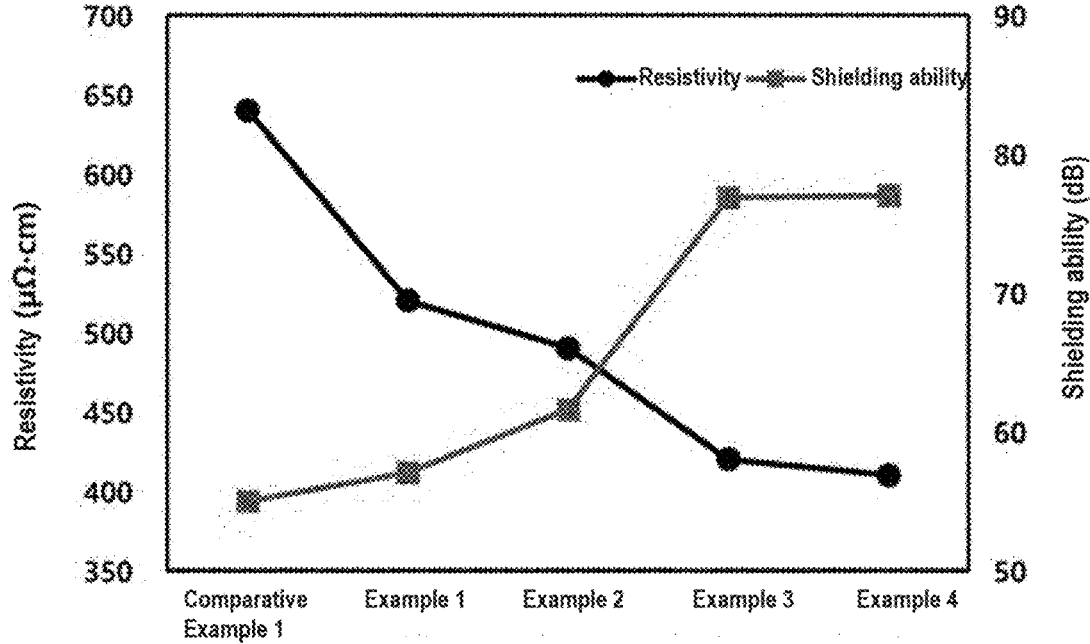

ELECTROMAGNETIC SHIELDING COMPOSITION CONTAINING MORPHOLOGICALLY DIFFERENT METALS

TECHNICAL FIELD

The present invention relates to an electromagnetic shielding composition including morphologically different metals, and more particularly, to an electromagnetic shielding composition having excellent electromagnetic shielding ability, resulting from a network structure formed by morphologically different metal materials in the electromagnetic shielding composition.

BACKGROUND ART

In recent years, a problem of electromagnetic interference due to miniaturization, thinness, and high integration of electronic devices along with increased use of electrical and electronic components has become serious, and a demand for wearable devices is steadily increasing.

In order to solve the problem of electromagnetic interference, an electromagnetic shielding film is attached to a circuit board of the electronic devices, and generally, the electromagnetic shielding film attached to the circuit board of the electronic device may be formed from an electromagnetic shielding composition, and the electromagnetic shielding composition is being provided in a configuration including a polymer resin and a conductive filler.

As such, the electromagnetic shielding film is required to have not only excellent electromagnetic shielding ability but also characteristics which are strong against deformation such as bending so that the film is appropriate for a wearable device, and for this, Korean Patent Laid-Open Publication No. 10-2016-0135512 provides an electromagnetic shielding film including a shielding layer including a double-structured metal structure. The shielding layer disclosed in the patent document provides an electromagnetic shielding film having improved bendability by including a double-structured metal structure in a resin, that is, a metal structure having a wire shape with a double structure composed of a second metal surrounding a first metal.

However, when only a wire form is included as a conductive filler in the electromagnetic shielding composition, due to the thinning of electronic devices, apparent density included in the electromagnetic shielding composition is low and an amount of the conductive filler in a wire form occupying a large volume is bound to be limited, and thus, the electromagnetic shielding rate may not be improved above a certain level. In addition, economic feasibility may be decreased due to an increase in a conductive filler content used for achieving a targeted electromagnetic shielding ability.

Thus, an economical electromagnetic shielding composition which may provide a thinned electromagnetic shielding film having both excellent electromagnetic shielding ability and excellent bendability needs to be developed.

RELATED ART DOCUMENT

Patent Document

Korean Patent Laid-Open Publication No. 10-2016-0135512

DISCLOSURE

Technical Problem

An object of the present invention is to provide an electromagnetic shielding composition which may form a thinned electromagnetic shielding film having both excellent electromagnetic shielding ability and excellent bendability.

Another object of the present invention is to provide an electromagnetic shielding composition which has excellent electromagnetic shielding efficiency and is economical.

Technical Solution

In one general aspect, an electromagnetic shielding composition includes: metal nanowires having a core-shell structure including a core containing copper and a shell containing silver on the core; and plate-shaped metal particles selected from plate-shaped silver particles and plate-shaped silver-coated copper particles.

In an exemplary embodiment of the present invention, the metal nanowires may have a diameter of 200 to 500 nm and an aspect ratio of 5 to 50.

In an exemplary embodiment of the present invention, a diameter of the core may be larger than a thickness of the shell in the metal nanowires.

In an exemplary embodiment of the present invention, a thickness of the shell of the metal nanowires may be 20 to 60 nm.

In an exemplary embodiment of the present invention, an aspect ratio (D/L) of a plane direction major axis length (D) and a thickness (L) of the plate-shaped metal particles may be 5 to 40.

In an exemplary embodiment of the present invention, an aspect ratio (AR1) of the plate-shaped metal particles may satisfy the following Equation 1 for an aspect ratio (AR2) of the metal nanowires:

$$AR1 \leq AR2. \tag{Equation 1}$$

In an exemplary embodiment of the present invention, a plurality of plate-shaped metal particles in the electromagnetic shielding composition may have an anisotropic orientation.

In an exemplary embodiment of the present invention, a full width half maximum (FWHM) of a (111) crystal plane of silver contained in the shell may be larger than a FWHM of a (111) crystal plane of copper contained in the core.

In an exemplary embodiment of the present invention, a weight ratio of the plate-shaped metal particles:the metal nanowires included in the electromagnetic shielding composition may be 1:1 to 15.

In an exemplary embodiment of the present invention, a weight ratio of the plate-shaped metal particles:the metal nanowires included in the electromagnetic shielding composition may be 1:2 to 4.

In an exemplary embodiment of the present invention, the electromagnetic shielding composition may further include a binder.

In an exemplary embodiment of the present invention, the binder may be an organic binder or a ceramic binder.

In another general aspect, an electromagnetic shielding film manufactured using the electromagnetic shielding composition described above is provided.

In the electromagnetic shielding film according to an exemplary embodiment, the electromagnetic shielding film may have a thickness of 20 to 60 μm.

In the electromagnetic shielding film according to an exemplary embodiment, the electromagnetic shielding film may have an electromagnetic shielding rate of 50 dB or more in a frequency range of 26.5 GHz to 40 GHz.

Advantageous Effects

The electromagnetic shielding composition according to the present invention includes metal nanowires having a core-shell structure including a core containing copper and a shell containing silver on the core; and plate-shaped metal particles selected from plate-shaped silver particles and plate-shaped silver-coated copper particles, thereby having a network structure formed by a connection between metal materials in the shielding composition and providing an economical electromagnetic shielding composition which may form an electromagnetic shielding film having both excellent electromagnetic shielding ability and excellent bendability resulting from the network structure.

DESCRIPTION OF DRAWINGS

FIG. 1 is a drawing showing a schematic diagram of dissimilar metals of silver-coated copper nanowires and plate-shaped silver particles being mixed which are included in an electromagnetic shielding composition according to an exemplary embodiment.

FIG. 2 is a graph showing changes in resistivity and electromagnetic shielding ability according to Examples 1 to 4 and Comparative Example 1.

BEST MODE

Hereinafter, the electromagnetic shielding composition of the present invention will be described in detail with reference to the accompanying drawings. The drawings to be provided below are provided by way of example so that the spirit of the present invention can be sufficiently transferred to a person skilled in the art to which the present invention pertains. Therefore, the present invention is not limited to the drawings provided below but may be embodied in many different forms, and the drawings suggested below may be exaggerated in order to clarify the spirit of the present invention. Technical terms and scientific terms used herein have the general meaning understood by those skilled in the art to which the present invention pertains unless otherwise defined, and a description for the known function and configuration which may unnecessarily obscure the gist of the present invention will be omitted in the following description and the accompanying drawings.

In addition, the singular form used in the specification and claims appended thereto may be intended to include a plural form also, unless otherwise indicated in the context.

In the present specification and the appended claims, the terms such as "comprise" or "have" mean that there is a characteristic or a constitutional element described in the specification, and as long as it is not particularly limited, a possibility of adding one or more other characteristics or constitutional elements is not excluded in advance.

In the present specification, a "nanowire" refers to a filler having a nanometer-sized diameter and having a long shape like a wire, which is used as a conductive filler.

The electromagnetic shielding composition according to the present invention includes: metal nanowires having a core-shell structure including a core containing copper and a shell containing silver on the core; and plate-shaped metal particles selected from plate-shaped silver particles and plate-shaped silver-coated copper particles.

Conventionally, a shielding layer formed from an electromagnetic shielding composition including only a wire-shaped conductive filler showed improved properties in terms of bendability, but in the case of including only the wire form as the conductive filler included in the electromagnetic shielding composition, when a thinned electromagnetic shielding film is provided, apparent density included in the electromagnetic shielding composition is low and the content of the conductive filler having only a wire shape which occupies a large volume is bound to be limited, and thus, the electromagnetic shielding rate may not be improved above a certain level.

However, since the electromagnetic shielding composition according to the present invention includes not only metal nanowires having a core-shell structure including a core containing copper and a shell containing silver on the core, but also plate-shaped metal particles selected from plate-shaped silver particles and plate-shaped silver-coated copper particles, it has an advantage of providing, in addition to an electrically connected network structure, an additional electrical connection path through a contact between the electrically connected network structure and the plate-shaped metal particles by the metal nanowires having a core-shell structure, in providing a thinned electromagnetic shielding film using the electromagnetic shielding composition of the present invention.

Due to the structure, when an electromagnetic shielding film is provided using the electromagnetic shielding composition according to an exemplary embodiment of the present invention, the film may have more improved electrical conductivity properties, and thus, a thinned electromagnetic shielding film which has excellent bendability resulting from the metal nanowire network structure of the core-shell structure and also excellent electromagnetic shielding ability from the improved electrical conductivity may be provided.

In addition, in the electromagnetic shielding composition, an electrically connected network effect formed by morphologically different metals, that is, metal nanowires having a core-shell structure and plate-shaped metal particles is maximized, whereby even in the case of including a less content of a conductive filler than before, an electromagnetic shielding rate may be equivalent or higher, and thus, an economical electromagnetic shielding composition may be provided.

In an exemplary embodiment of the present invention, the metal nanowire may have a core-shell structure including a core containing copper and a shell containing silver on the core.

The metal nanowire having a core-shell structure is characterized by having better oxidation stability and thermal stability than conventional copper nanowires, copper spherical particles which are not coated with silver, copper flake shapes, and the like, due to the core containing copper and the shell containing silver on the core, and has a large aspect ratio than a particle shape and/or flake shape, and thus, has an advantage of providing an effect of lowering sheet resistance of an electromagnetic shielding film formed using the electromagnetic shielding composition of the present invention and an excellent electromagnetic shielding effect thereof, by an electrically connected network effect.

In addition, a cost saving effect as compared with use of silver nanowires may be shown.

In a specific example, the metal nanowire may have a diameter of 100 to 800 nm, specifically 200 to 500 nm, and more specifically 250 to 400 nm, and may have an aspect ratio of 2 to 80, preferably 5 to 50, and more preferably 10 to 40. Herein, the aspect ratio of the metal nanowire refers to a ratio of the length to the diameter of the metal nanowire.

In general, as a shielding effect of an electromagnetic interference phenomenon, electromagnetic shielding efficiency is better with increased electrical conductivity, and in order for the metal nanowires to have excellent dispersibility, high conductivity, and a wide electron transfer path as compared with the surface area to have improved electrical properties in the electromagnetic shielding composition, it is advantageous that the diameter of the metal nanowires satisfies the range described above.

In addition, when the aspect ratio of the metal nanowire is less than 2, a contact between the metal nanowires is limited and electromagnetic shielding efficiency may also be decreased due to the deteriorated electrical properties. When the aspect ratio of the metal nanowire is more than 80, the contact between the metal nanowires may be increased, but the dispersibility may be lowered in the electromagnetic shielding composition due to agglomeration of the metal nanowires, and thus, sheet resistance properties may be deteriorated when forming the electromagnetic shielding film using the electromagnetic shielding composition and physical breakage of the metal nanowire may occur. Accordingly, a contact point where the metal nanowires providing an electrical connection path come into contact with each other is secured, so that the metal wire may have improved electrical properties, and in order to suppress agglomeration of the metal nanowires when forming the electromagnetic shielding film using the electromagnetic shielding composition and prevent the physical breakage of the metal nanowire, it is preferred that the aspect ratio of the metal nanowire satisfies the range described above.

As an example, the metal nanowire may have a length of 500 nm to 50 μm, preferably 1 to 35 μm, and more preferably 3 to 20 μm.

In an exemplary embodiment, the diameter of the core may be larger than the thickness of the shell in the metal nanowire, and as a specific example, the thickness of the shell of the metal nanowire may be 10 to 80 nm, advantageously 20 to 60 nm, and more advantageously 25 to 40 nm.

Considering an economic aspect in a range where the shell containing silver of the metal nanowire may provide an excellent electromagnetic shielding effect and oxidation stability, it is preferred that the thickness of the shell of the metal nanowire satisfies the range described above.

In a specific example, in the metal nanowire, a full width half maximum (FWHM) of a (111) crystal plane of silver contained in the shell may be larger than a FWHM of a (111) crystal plane of copper contained in the core.

Herein, it is shown that the crystal size of silver is smaller than the crystal size of copper from the fact that the full width half maximum refers to the full width half maximum of an X-ray diffraction peak, and the full width half maximum of the (111) crystal plane of silver contained in the shell is larger than the full width half maximum of the (111) crystal plane of copper contained in the core in the metal nanowire having a core-shell structure, and thus, the metal nanowire has excellent oxidation stability.

As described above, the electromagnetic shielding composition according to the present invention includes plate-shaped metal particles selected from plate-shaped silver particles and plate-shaped silver-coated copper particles.

Herein, the plate-shaped metal particles may refer to metal particles in which the shape of the metal particles is a two-dimensional structure, but the thickness (L) in the two-dimensional structure is a nanometer level which is a plate form.

As an example, the plate-shaped metal particles may be selected from plate-shaped silver particles and plate-shaped silver-coated copper particles, and the silver-coated copper particles may have a thickness of coated silver of 5 to 50 nm, advantageously 10 to 40 nm, and more advantageously 20 to 30 nm.

Though the surface shape of the plate-shaped metal particles is not limited, as an example, the surface shape of the plate-shaped metal particles may include one or more shapes selected from circular and polygonal.

Since the electromagnetic shielding composition according to the present invention includes plate-shaped metal particles together with the metal nanowires described above, an additional electrical connection path through a contact between a network structure which is electrically connected by a contact between metal nanowires and plate-shaped metal particles is provided, and thus, the composition may have further improved electrical conductivity, and when the composition is formed into an electromagnetic shielding film, a density in a plane direction of the electromagnetic shielding film is high, and thus, significantly improved electromagnetic shielding efficiency may be provided.

In an exemplary embodiment, the plate-shaped metal particle may have a thickness (L) of 100 to 800 nm, specifically 200 to 600 nm, and more specifically 300 to 500 nm.

As a specific example, an aspect ratio (D/L) between a plane direction major axis length (D) and the thickness (L) of the plate-shaped metal particles may be 2 to 70, advantageously 5 to 40, and more advantageously 5 to 30.

As an example, the plate-shaped metal particle may have a plane direction major axis length of 0.1 to 50 μm, specifically 1 to 25 μm, and more specifically 3 to 15 μm.

Since the plate-shaped metal particles included in the electromagnetic shielding composition according to the present invention have the thickness and the aspect ratio (D/L) in the ranges described above, the electromagnetic shielding film formed using the electromagnetic shielding composition of the present invention has further improved electrical conductivity, and thus, may provide significantly improved electromagnetic shielding efficiency, and also may have excellent bendability.

As an exemplary embodiment of the present invention, an aspect ratio (AR1) of the plate-shaped metal particles may satisfy the following Equation 1 for an aspect ratio (AR2) of the metal nanowires:

$$AR1 \leq AR2. \qquad \text{(Equation 1)}$$

When the aspect ratio (AR1) of the plate-shaped metal particles is larger than the aspect ratio (AR2) of the metal nanowires, a network effect which is electrically connected by a contact or a crosslinked structure between metal nanowires may be decreased to lower the electromagnetic shielding efficiency, and thus, in order for the electromagnetic shielding composition to provide excellent electromagnetic shielding ability, the aspect ratio (AR1) of the plate-shaped metal particles satisfies Equation 1 for the aspect ratio (AR2) of the metal nanowires.

The electromagnetic shielding composition according to the present invention may include a plurality of plate-shaped metal particles, and the plurality of plate-shaped metal particles may have an anisotropic orientation in the composition.

By including the plate-shaped metal particles having an anisotropic orientation in the electromagnetic shielding composition, an area where there is no contact between metal nanowires, that is, an area having no electrical connection may be effectively connected, so that the electromagnetic shielding composition may provide improved electrical conductivity, and also, change in electrical properties hardly occurs even with deformation such as bending.

As an example, the plate-shaped metal particles included in the electromagnetic shielding composition may be included at 1 to 40 wt %, advantageously 5 to 30 wt %, more advantageously 8 to 30 wt %, still more advantageously 10 to 25 wt %, and still more advantageously 15 to 20 wt %, based on the total weight of the composition.

In an exemplary embodiment of the present invention, a weight ratio of the plate-shaped metal particles:the metal nanowires included in the electromagnetic shielding composition may be 1:1 to 15, specifically 1:1.5 to 10, more specifically 1:1.5 to 5, and still more specifically 1:2 to 4.

Since the weight ratio of the plate-shaped metal particles: metal nanowire included in the electromagnetic shielding composition satisfies the above range, the electrically connected network effect is maximized, and thus, electrical percolation may occur even with the inclusion of a lower content of a conductive filler in the electromagnetic shielding composition than before.

However, since electrical percolation may show electrical conductivity by electron hopping in a separated distance within 5 nm as well as a direct contact between conductive fillers, when the plate-shaped metal particles are included at more than 30 wt % in the electromagnetic shielding composition, electrical properties shown by electron hopping are decreased to raise a percolation threshold per unit weight, and thus, in order to be economical, have excellent electrical properties, and improve electromagnetic shielding efficiency, the plate-shaped metal particles included in the electromagnetic shielding composition is included to satisfy the range in wt %, and it may be more advantageous that the upper limit is 30 wt % or less or 25 wt % or less.

Furthermore, unlike the conventional technology including only the wire-shaped conductive filler, when the electromagnetic shielding film which is thinned by the plate-shaped metal particles included in the above range in the electromagnetic shielding composition is provided, it may be advantageous in overcoming the disadvantage of not improving the electromagnetic shielding rate to above a certain level due to a conventional wire-shaped conductive filler which has a low apparent density and occupies a large volume.

In an exemplary embodiment, the electromagnetic shielding composition may further include a binder, and the binder may be included at 5 to 30 wt %, specifically 10 to 30 wt % of the total weight of the electromagnetic shielding composition.

In a specific example, the binder may be an organic binder or a ceramic binder, the organic binder may be, specifically, one or more selected from organic resins such as epoxy-based resin, acrylic resin, silicone resin, urethane resin, fluorine rubber, nitrile rubber, ethyl cellulose, ethylhydroxyethyl cellulose, and nitrocellulose, and the epoxy-based resin may be any one or two or more epoxy resins selected from bisphenol A-type epoxy resin, bisphenol F-type epoxy resin, bisphenol S-type epoxy resin, phenol novolac type epoxy resin, cresol novolac type epoxy resin, alkylphenol novolac type epoxy resin, biphenyl type epoxy resin, naphthalene type epoxy resin, dicyclopentadiene type epoxy resin, triglycidyl isocyanate, urethane modified epoxy resin, and epoxy resin, and the like, but is not limited thereto.

The ceramic binder is a polymer having a polysiloxane main chain in which a silicon (Si) atom and an oxygen (O) atom alternate, and generally, silicone has a structure in which usually two organic atom groups of alkyl such as methyl, ethyl, and propyl or phenyl ($-C6H5$) are bonded to each silicon atom. The ceramic binder included in the electromagnetic shielding composition according to the present invention may have hydrogen, a hydroxyl group, a methyl group, or a phenyl group which is bonded thereto, and as an example, may be a polydimethylsiloxane-based resin including a dimethylsiloxane repeating unit, and may be a polysiloxane-based resin further including a methylphenylsiloxane repeating unit, an ethylphenylsiloxane repeating unit, or a diphenylsiloxane repeating unit.

When the electromagnetic shielding composition of the present invention is applied on a substrate by a method such as coating or casting, it may be uniformly applied, and may have a viscosity measured at 25° C. for increasing processability of 50,000 to 300,000 cps, specifically 70,000 to 250,000 cps, and the viscosity in the range described may be adjusted by further including a solvent in the electromagnetic shielding composition.

The solvent may be included at 5 to 30 wt % based on the total weight of the electromagnetic shielding composition, but is not limited thereto.

As a specific example, the solvent may be any one or two or more selected from acetone, methyl ethyl ketone, methyl alcohol, ethyl alcohol, isopropyl alcohol, butyl alcohol, ethylene glycol, polyethylene glycol, tetrahydrofuran, dimethylformamide, dimethylacetamide, N-methyl-2-pyrrolidone, hexane, cyclohexanone, toluene, chloroform, dichlorobenzene, dimethylbenzene, trimethylbenzene, pyridine, methylnaphthalene, nitromethane, acrylonitrile, octadecylamine, butyl carbitol acetate, aniline, dimethylsulfoxide, diethylene glycol ethyl ether, and terpineol.

The present invention provides an electromagnetic shielding film (coating layer) which is formed after applying the electromagnetic shielding composition of the present invention on a substrate and then performing a heat treatment.

Specifically, the electromagnetic shielding composition described above may be applied on the substrate so that a wet thickness is 50 to 500 μm, preferably 50 to 300 μm, and more preferably 50 to 200 μm. Herein, the wet thickness refers to a thickness formed on a substrate before the heat treatment after applying the electromagnetic shielding composition on a substrate.

The substrate may be a substrate manufactured of an organic or inorganic material, and as a specific example, may be a plastic substrate, a glass substrate, or a quartz substrate, or the like. An example of the material forming the substrate described above may include methacrylic resin, aromatic polyester, modified polyphenylene oxide (MPPO), cellulose ester, cellulose acetate, quartz, styrene-butadiene copolymer, silicon wafer, acrylonitrile butadiene styrene copolymer (ABS resin), epoxy resin, olefin maleimide copolymer, fused silica, glass, regenerated cellulose, triacetyl cellulose, phenol resin, polydimethylcyclohexene terephthalate, polydimethylsiloxane (PDMS), polymethyl methacrylate, polymethyl acrylate, polybutadiene, polybutylene terephthalate, polyfluorovinylidene, polyvinylidene fluoride, polyvinyl acetate, polysulfonate, polysulfone, polystyrene (PS), polysilazane, polysilane, polysiloxane, polyaramid, polyarylate, polyamide, polyarylate, polyamide, polyamideimide, polyacrylate, polyacrylonitrile (PAN), polyester, polyethersulfone (PES), polyether nitrile, polyether sulfone, polyetherimide, polyether ketone, polyethylene naphthalate (PEN), polyethylene sulfone, polyethylene (PE), polyethylene terephthalate (PET), polyethyl metacrylate, polyethyl acrylate, polyepoxide, polyvinyl chloride, polyoxyethylene, polyolefin, polyurethane, polyimide resin, polycarbosilane, polycarbonate, polyphenylene sulfide, polyphenylene ether, polypropylene (PP), AS resin, GaAs, MgO, silica, polyvinyl chloride, polydimethylcyclohexene terephthalate, and the like, but is not limited thereto.

As an example, before applying the electromagnetic shielding composition according to the present invention on a substrate, the surface of the substrate may be optionally further treated using at least one method of a Piranha solution treatment, an acid treatment, a base treatment, a plasma treatment, a plasma treatment at normal pressure, an ozone treatment, a UV treatment, a self-assembled monolayer (SAM) treatment, and a polymer or monomolecular coating method, of course.

The electromagnetic shielding composition of the present invention may be coated on the substrate described above by a coating method selected from spray coating, gravure coating, microgravure coating, bar-coating, knife coating, reverse roll coating, roll coating, calender coating, curtain coating, extrusion coating, cast coating, dip coating, airknife coating, foam coating, slit coating, and the like, but is not limited thereto.

The electromagnetic shielding composition coated at the wet thickness in the above range on the substrate using the application method described above may be formed as an electromagnetic shielding film (coating layer) by a heat treatment, and the heat treatment may be performed at 100 to 300° C. for 10 to 60 minutes, specifically at 100 to 250° C., and more specifically 100 to 200° C. for 10 to 60 minutes.

As an exemplary embodiment, the coating layer formed after the heat treatment of the electromagnetic shielding composition applied on the substrate may have a thickness of 5 to 100 μm, preferably 10 to 80 μm, and more preferably 20 to 60 μm.

In an exemplary embodiment of the present invention, the electromagnetic shielding film (coating layer) may have an electromagnetic shielding rate of 45 dB or more, 50 dB or more, 55 dB or more, 60 dB or more, 62 dB or more, 64 dB or more, 66 dB or more, 68 dB or more, 70 dB or more, 72 dB or more, 74 dB or more, 76 dB or more, 78 dB or more, 80 dB or more in a frequency range of 26.5 GHz to 40 GHz, and though the upper limit of the electromagnetic shielding rate is not limited, may be 100 dB or less.

Herein, the electromagnetic shielding rate may be a value measured by a transmission-line method using a wave guide method for an electromagnetic shielding film (coating layer) in a thickness range of 35 to 45 μm, and the electromagnetic shielding rate properties may be differently shown depending on the thickness of the electromagnetic shielding film (coating layer), of course.

As described above, the electromagnetic shielding composition including the metal nanowires having a core (containing copper)-shell (containing silver) structure and the plate-shaped metal particles according to the present invention has a maximized effect of an electrically connected network structure, and though a coating layer having a small thickness is formed, electromagnetic shielding efficiency is significantly excellent.

Hereinafter, the electromagnetic shielding composition according to the present invention will be described in more detail by the following examples. However, the following examples are only a reference for describing the present invention in detail, and the present invention is not limited thereto and may be implemented in various forms.

In addition, unless otherwise defined, all technical terms and scientific terms have the same meanings as those commonly understood by a person skilled in the art to which the present invention pertains. The terms used herein are only for effectively describing a certain exemplary embodiment, and not intended to limit the present invention.

(Example 1) Electromagnetic Shielding Composition Including Prepared Silver-Coated Copper Nanowires and Plate-Shaped Silver Particles at 48 wt % and 5 wt %, Respectively Silver-coated copper nanowires having a core-shell structure (Bioneer Corporation), plate-shaped silver particles (Ag Flake, HP-2020-E, P&Dritech), an epoxy resin (SE-55F, Shin-A T&C), a curing agent (XHT-1004, Shin-A T&C), terpineol (α-terpineol, KANTO), and butyl carbitol acetate (Samchun Chemicals) were mixed in a 100 ml plastic container to prepare a mixture, so that the prepared silver-coated copper nanowires and plate-shaped silver particles were included at 48 wt % and 5 wt %, respectively, and the mixture was stirred at 2000 rpm for about 10 minutes with an orbital rotation type mixer (ARE-310, THINKY). Then, a 3-roll mill (EXAKT 501) was used to perform a dispersion treatment 5 times. The dispersed mixture was stirred at 2000 rpm for about 10 minutes with the orbital rotation type mixer (ARE-310, THINKY) to prepare an electromagnetic shielding composition. At this time, silver-coated copper nanowires had an average diameter of 300.4 nm and an average length of 5.2 μm, and plate-shaped silver particles had an average thickness of 452.1 nm and a plane direction major axis length (D) of 5.4 μm.

A schematic diagram of the dissimilar metals of the silver-coated copper nanowires and the plate-shaped silver particles being mixed included in the electromagnetic shielding composition is shown in FIG. 1.

For an electromagnetic shielding test of the electromagnetic shielding composition prepared in Example 1, 10 ml of the electromagnetic shielding composition was added to the surface of a polyimide film of 100 mm×100 mm, and a bar coater (COATMASTER 510, ERICHSEN) was used to perform coating at a wet thickness of 100 μm. A film formed after the coating was heated to 150° C. at a heating rate of 2° C./min in a dry oven, and heat-treated at 150° C. for 30 minutes to form an electromagnetic shielding coating layer. At this time, a final dried thickness of the electromagnetic shielding coating layer was about 40 μm.

(Example 2) Electromagnetic Shielding Composition Including Prepared Silver-Coated Copper Nanowires and Plate-Shaped Silver Particles at 46 wt % and 9 wt %, Respectively A shielding composition was prepared in the same manner as in Example 1, except that prepared silver-coated copper nanowires and plate-shaped silver particles were used so that they were included at 46 wt % and 9 wt %, respectively, in the composition. The prepared shielding composition was manufactured into an electromagnetic shielding film.

(Example 3) Electromagnetic Shielding
Composition Including Prepared Silver-Coated
Copper Nanowires and Plate-Shaped Silver
Particles at 42 wt % and 17 wt %, Respectively A shielding composition was prepared in the same manner as in Example 1, except that prepared silver-coated copper nanowires and plate-shaped silver particles were used so that they were included at 42 wt % and 17 wt %, respectively in the composition. The prepared shielding composition was manufactured into an electromagnetic shielding film.

(Example 4) Electromagnetic Shielding
Composition Including Prepared Silver-Coated
Copper Nanowires and Plate-Shaped Silver
Particles at 39 wt % and 23 wt %, Respectively A shielding composition was prepared in the same manner as in Example 1, except that prepared silver-coated copper nanowires and plate-shaped silver particles were used so that they were included at 39 wt % and 23 wt %, respectively in the prepared composition. The prepared shielding composition was manufactured into an electromagnetic shielding film.

(Comparative Example 1) Electromagnetic
Shielding Composition Including 51 wt % of
Prepared Silver-Coated Copper Nanowires A shielding composition was prepared in the same manner as in Example 1, except that only prepared silver-coated copper nanowires were used without including plate-shaped silver particles so that 51 wt % of the silver-coated copper nanowires were included. The prepared shielding composition was manufactured into an electromagnetic shielding film.

Due to the nature of the nanowire form which has a low apparent density and occupies a large volume, when a filler was contained above a certain level, the viscosity of the electromagnetic shielding composition was increased, so that manufacture was impossible. Therefore, in Comparative Example 1, the content of the silver-coated copper nanowires was added to the maximum extent possible in the preparation of the shielding composition, and a filler in the wire form was not able to be added any further. However, the content value of the nanowires may be changed depending on the physical property ratio of the composition component except for the filler.

(Comparative Example 2) Electromagnetic
Shielding Composition Including 59 wt % of
Plate-Shaped Silver Particles In order to verify the excellence of the electromagnetic shielding composition using the morphologically different conductive filler of the present invention, an electromagnetic shielding composition was prepared only with the plate-shaped silver particles except for the silver-coated copper nanowires. Specifically, an electromagnetic shielding composition was prepared in the same manner as in Example 1, except that only the plate-shaped silver particles were used so that they were included at 59 wt % without including the prepared silver-coated copper nanowires. The prepared shielding composition was manufactured into an electromagnetic shielding film.

Experimental Example

The resistivity, the resistivity change rate, and the electromagnetic shielding properties of the formed electromagnetic shielding coating layer were confirmed using each of the electromagnetic shielding compositions, and the results are summarized in the following Table 1 and the change in resistivity and electromagnetic shielding ability according to Examples 1 to 4 and Comparative Example 1 are shown in FIG. 2.

At this time, as the electromagnetic properties, the electromagnetic shielding ability was measured in a frequency range of 26.5 GHz to 40 GHz using a wave guide method, and in order to measure the resistivity change rate, a center part of a polyimide film on which an electromagnetic shielding coating layer was formed was supported, 100 cycles of bending were applied in which both ends were moved up and down simultaneously by 3 cm to perform bending as one cycle, and then the resistivity value was measured again. The resistivity change rate was a ratio of the resistivity value measured after the bending test to the initial resistivity value expressed as a percentage.

TABLE 1

| Item | Initial resistivity ($\mu\Omega \cdot cm$) | Shielding ability (dB) | Resistivity change rate (%) |
|---|---|---|---|
| Example 1 | 520 | 57 | 99.8 |
| Example 2 | 490 | 62 | 99.8 |
| Example 3 | 420 | 77 | 100.1 |
| Example 4 | 415 | 77 | 100.8 |
| Comparative Example 1 | 640 | 55 | 99.8 |
| Comparative Example 2 | 500 | 60 | 121.1 |

Referring to Table 1, it is shown that the resistivity of Comparative Example 1 was 640 $\mu\Omega$·cm, which was a higher value than the resistivities of Examples 1 to 4 including plate-shaped silver particles.

In addition, the resistivity of Example 1 was measured as 520 $\mu\Omega$·cm, and the resistivity was confirmed to be lowered to 415 $\mu\Omega$·cm in the results of Example 4.

When the electromagnetic shielding composition was prepared using only the silver-coated copper nanowires, the apparent density of the nanowires was low and the viscosity of the composition was increased when mixed with a binder, which made the process impossible when manufacturing a film using the composition, and thus, there was a limitation in adding the amount of the filler. That is, it was suggested that when only the nanowire-shaped filler was used, there was a limitation in improving electromagnetic shielding ability.

However, as shown from the results of Examples 1 to 4, when the electromagnetic shielding composition was prepared by mixing plate-shaped silver particles and silver-coated copper nanowires which had morphologically different forms, an electrical percolation effect between metals was increased, so that an electromagnetic shielding composition having lower resistivity was able to be prepared.

However, when Examples 3 and 4 were compared, the resistivities were 420 $\mu\Omega$·cm and 415 $\mu\Omega$·cm, which were similar result values. It was confirmed therefrom that even in the case of increasing the plate-shaped silver particles more than the conditions of Example 3, the resistivity was not decreased any further. In addition, since similar performance was shown with a smaller amount of the filler, it is said that the composition ratio in Example 3 was more economical than in Example 4.

Further, the resistivity of Comparative Example 2 was 500 $\mu\Omega$·cm, which was a higher value than 420 $\mu\Omega$·cm of the resistivity of Example 3 having the same filler content. This shows that electrical percolation was increased to improve conductivity in a mixed composition of nanowire forms and plate-shaped particles which are morphologically different metals rather than in a composition formed of only plate-shaped particles. In addition, the silver-coated copper nanowires replaced a part of the plate-shaped silver particles at the same filler content, whereby high-priced silver particles were not able to be used to provide economic feasibility.

The electromagnetic shielding ability was measured as about 57 dB in the electromagnetic shielding composition of Example 1, about 62 dB in Example 2, and 77 dB identically in Examples 3 and 4.

As such, the electromagnetic shielding rate of the coating layer having a thickness of 40 μm in a frequency range of 26.5 GHz to 40 GHz was measured from 57 dB to 77 dB in all of Examples 1 to 4, while the electromagnetic shielding rate of Comparative Example 1 using only the silver-coated copper nanowires was measured as about 55 dB and it was confirmed that there was a limitation.

It was confirmed therefrom that the electromagnetic shielding composition in which the silver-coated copper nanowires and the plate-shaped silver particles were mixed at a certain ratio had excellent shielding ability improved by about 40% as compared with the composition including no plate-shaped silver particles.

In addition, when the electromagnetic shielding composition was prepared using only the plate-shaped silver particles of Comparative Example 2, electromagnetic shielding ability was measured as 60 dB, which showed lower performance by about 20% than that of Example 3 having the same filler content.

Additionally, it was confirmed that Comparative Example 2 using only the plate-shaped silver particles had a rough surface formed during the formation of the electromagnetic shielding film to have poor moldability. In addition, it was confirmed that the resistivity change rate after the bending test was rapidly increased to about 121.1% as compared with the initial resistivity, but was maintained at almost the same level as the initial resistivity value in all of Examples 1 to 4. The characteristics resulted from the percolation effect as well as a direct contact of the fillers present in the electromagnetic shielding film.

Furthermore, as a result of reproducing a plurality of electromagnetic shielding films using each of the prepared compositions, it was observed that the resistivity properties and the electromagnetic shielding properties were reproducibly shown in Examples 1 to 4, but the reproducibility was significantly lowered in Comparative Example 2.

Hereinabove, although the present invention has been described by the specific matters and specific exemplary embodiments, they have been provided only for assisting in the entire understanding of the present invention. Therefore, the present invention is not limited to the exemplary embodiments, and various modifications and changes may be made by those skilled in the art to which the present invention pertains from this description.

Therefore, the spirit of the present invention should not be limited to the above-described exemplary embodiments, and the following claims as well as all modifications equal or equivalent to the claims are intended to fall within the scope and spirit of the invention.

The invention claimed is:

1. An electromagnetic shielding composition comprising:
metal nanowires having a core-shell structure including a core containing copper and a shell containing silver on the core; and plate-shaped metal particles selected from plate-shaped silver particles and plate-shaped silver-coated copper particles, wherein a weight ratio of the plate-shaped metal particles: metal nanowires included in the electromagnetic shielding composition is 1:1 to 15, and
wherein the plate-shaped metal particles are included at 30 wt % or less in the electromagnetic shielding composition.

2. The electromagnetic shielding composition of claim 1, wherein the metal nanowire has a diameter of 200 to 500 nm and an aspect ratio of 5 to 50.

3. The electromagnetic shielding composition of claim 2, wherein a diameter of the core of the metal nanowire is larger than a thickness of the shell.

4. The electromagnetic shielding composition of claim 3, wherein the thickness of the shell of the metal nanowire is 20 to 60 nm.

5. The electromagnetic shielding composition of claim 1, wherein an aspect ratio (D/L) of a plane direction major axis length (D) and a thickness (L) of the plate-shaped metal particles is 5 to 40.

6. The electromagnetic shielding composition of claim 1, wherein an aspect ratio (AR1) of the plate-shaped metal particles satisfies Equation 1 for an aspect ratio (AR2) of the metal nanowires:

$$AR1 \le AR2 \qquad \text{(Equation 1)}.$$

7. The electromagnetic shielding composition of claim 1, wherein a plurality of plate-shaped metal particles in the composition have an anisotropic orientation.

8. The electromagnetic shielding composition of claim 1, wherein in the metal nanowires, a full width half maximum (FWHM) of a (111) crystal plane of silver contained in the shell is larger than a FWHM of a (111) crystal plane of copper contained in the core.

9. The electromagnetic shielding composition of claim 1, wherein a weight ratio of the plate-shaped metal particles: the metal nanowires included in the electromagnetic shielding composition is 1:2 to 4.

10. The electromagnetic shielding composition of claim 1, further comprising a binder.

11. The electromagnetic shielding composition of claim 10, wherein the binder is an organic binder or a ceramic binder.

12. An electromagnetic shielding film manufactured using the electromagnetic shielding composition of claim 1.

13. The electromagnetic shielding film of claim 12, wherein the electromagnetic shielding film has a thickness of 20 to 60 μm.

14. The electromagnetic shielding film of claim 13, wherein the electromagnetic shielding film has an electromagnetic shielding rate of 50 dB or more in a frequency range of 26.5 GHz to 40 GHz.

* * * * *